(12) United States Patent
Ishikawa et al.

(10) Patent No.: US 6,646,516 B2
(45) Date of Patent: Nov. 11, 2003

(54) COMPLEX CIRCUIT BOARD, NONRECIPROCAL CIRCUIT DEVICE, RESONATOR, FILTER, DUPLEXER, COMMUNICATIONS DEVICE, CIRCUIT MODULE, COMPLEX CIRCUIT BOARD MANUFACTURING METHOD, AND NONRECIPROCAL CIRCUIT DEVICE MANUFACTURING METHOD

(75) Inventors: Yohei Ishikawa, Kyoto (JP); Hiromu Tokudera, Nagaokakyo (JP); Kei Matsutani, Nagaokakyo (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/235,469

(22) Filed: Sep. 5, 2002

(65) Prior Publication Data
US 2002/0196093 A1 Dec. 26, 2002

Related U.S. Application Data

(62) Division of application No. 09/393,427, filed on Sep. 10, 1999, now Pat. No. 6,472,960.

(30) Foreign Application Priority Data

Sep. 11, 1998 (JP) .......................................... 10-258051
Jul. 27, 1999 (JP) .......................................... 11-212376

(51) Int. Cl.$^7$ ................................................ H01P 1/32
(52) U.S. Cl. ........................................ 333/1.1; 333/24.2
(58) Field of Search ................................ 333/1.1, 24.2, 333/219.2, 185, 204, 205

(56) References Cited

U.S. PATENT DOCUMENTS 5,197,170 A * 3/1993 Senda et al. ................ 29/25.42
5,448,211 A * 9/1995 Mariani ....................... 333/205

* cited by examiner

Primary Examiner—Benny Lee
Assistant Examiner—Stephen E. Jones
(74) Attorney, Agent, or Firm—Ostrolenk, Faber, Gerb & Soffen, LLP

(57) ABSTRACT

In a complex circuit board, the positional relationships between element portions, including an electrode pattern, a dielectric substrate and a magnetic substrate, can be adjusted as desired, and the complex circuit board can be miniaturized. The complex circuit board includes a dielectric substrate and a magnetic substrate, a space being provided between the magnetic substrate and the dielectric substrate, and an electrode pattern provided between the dielectric substrate and the magnetic substrate, a capacitance element portion of the electrode pattern being provided adjacent or in contact with or spaced a predetermined distance from the dielectric substrate, and the inductance element portion of the electrode pattern being provided adjacent or in contact with or spaced a predetermined distance from the magnetic substrate.

6 Claims, 11 Drawing Sheets

COMPLEX CIRCUIT BOARD, NONRECIPROCAL CIRCUIT DEVICE, RESONATOR, FILTER, DUPLEXER, COMMUNICATIONS DEVICE, CIRCUIT MODULE, COMPLEX CIRCUIT BOARD MANUFACTURING METHOD, AND NONRECIPROCAL CIRCUIT DEVICE MANUFACTURING METHOD

This is a division of U.S. patent application Ser. No. 09/393,427 (now U.S. Pat. No. 6,472,960), filed Sep. 10, 1999 in the name of Yohei ISHIKAWA, Hirmonu TOKUDERA and Kei MATSUTANI entitled COMPLEX CIRCUIT BOARD, NONRECIPROCAL CIRCUIT DEVICE, RESONATOR, FILTER, DUPLEXER, COMMUNICATIONS DEVICE, CIRCUIT MODULE, COMPLEX CIRCUIT BOARD MANUFACTURING METHOD, AND NONRECIPROCAL CIRCUIT DEVICE MANUFACTURING METHOD, claiming priority to Japanese Application No. 10-258051, filed Sep. 11, 1998, and Japanese Application No. 11-212376, filed Jul. 27, 1999.

BACKGROUND OF THE INVENTION

1. Field of the Invention

The present invention relates to a complex circuit board comprising an electrode clasped between a dielectric substrate and a magnetic substrate, a nonreciprocal circuit device, a resonator, a filter, a duplexer, a communications device, a circuit module, a method for manufacturing the complex circuit board, and a method for manufacturing the nonreciprocal circuit device.

2. Description of the Related Art

Conventionally, dielectric substrates or magnetic substrates having electrode patterns thereon, forming a capacitance element and/or an inductance element, for example, have been laminated in multiple stages to form a resonator circuit or the like. Depending on the application and desired characteristics and the like, low-profiling is sometimes required, and a conventional complex circuit board has been devised to satisfy such requirements.

A conventional complex circuit board will be explained based on FIGS. 23 and 24. FIG. 23 is a plan view of a conventional complex circuit board, and FIG. 24 is a cross-sectional view taken along the line W—W of FIG. 23.

As shown in FIGS. 23 and 24, the conventional complex circuit board 110 comprises a dielectric substrate 111, a magnetic substrate 112, and an electrode pattern 120 clasped therebetween. The electrode pattern 120 comprises a capacitance element 121, an inductance element 122, a transmission line 123, and the like, and ground electrodes 113 are provided on the outer faces of the dielectric substrate 111 and the magnetic substrate 112. The complex circuit board 110 of this constitution functions here as a low-pass filter.

In the conventional complex circuit board 110, the electrode pattern 120 is provided by using plating or the like to form electrodes 120a and 120b facing each other on the dielectric substrate 111 and the magnetic substrate 112, respectively, and by providing a connection electrode 120c thereabove. The electrode pattern 120 is completed by affixing together the electrodes 120a and 120b respectively provided on the dielectric substrate 111 and the magnetic substrate 112, with the connection electrode 120c therebetween.

The characteristics of the capacitance element, the inductance element, resistors, transmission lines, and the like, which are provided on the complex circuit board, alter according to their positional relationships to the dielectric substrate and the magnetic substrate. For instance, the inductance element achieves a greater inductance when it is near to the magnetic substrate. Moreover, when the inductance element is near to the magnetic substrate, it can be miniaturized while obtaining the same inductance. Similarly, the capacitance element achieves a greater capacitance when it is near to the dielectric substrate, and it can be miniaturized while still obtaining the same capacitance.

However, in the conventional complex circuit board, since the electrode pattern clasped between the dielectric substrate and the magnetic substrate is formed by affixing together electrodes provided on the dielectric substrate and the magnetic substrate, the entire electrode pattern lies within a single plane. That is, the capacitance element, the inductance element, the resistors, the transmission lines, and the like are disposed all at an equal distance from the dielectric substrate and from the magnetic substrate.

Furthermore, although the inductance element obtains a larger inductance when it is provided nearer to the magnetic substrate, its inductance is lowered when a dielectric substrate is nearby, because the coupling of the inductance element to the dielectric becomes stronger.

Furthermore, in the case of a distributed constant nonreciprocal circuit device, for instance, the electrode comprises a resonator portion and a transmission line portion, and the nonreciprocity of the device when a dc magnetic field is applied thereto is increased by providing the resonator portion near to the magnetic substrate. However, when a dielectric substrate is provided nearby, the coupling of the resonator portion to the dielectric is strengthened, lowering the nonreciprocity of the device.

Therefore, when the capacitance element, the inductance element, and the like formed by the electrode pattern, clasped between the dielectric substrate and the magnetic substrate, are provided within a single plane, there are disadvantages that the inductance can be increased only by a limited value, the elements cannot be miniaturized, and consequently the complex circuit board cannot be miniaturized. There is an additional disadvantage that it is not possible to precisely design the characteristics of the capacitance element, the inductance element, the resistor, the transmission lines, and the like.

SUMMARY OF THE INVENTION

The complex circuit board, nonreciprocal circuit device, resonator, filter, duplexer, communications device, circuit module, method for manufacturing the complex circuit board, and method for manufacturing the nonreciprocal circuit device of the present invention have been realized in consideration of the problems described above, and aim to solve these problems by providing a complex circuit board, a nonreciprocal circuit device, a resonator, a filter, a duplexer, a communications device, and a circuit module, which can be miniaturized and have excellent characteristics, a method for manufacturing the complex circuit board, and a method for manufacturing the nonreciprocal circuit device.

In order to achieve the above objects, the complex circuit board of the present invention comprises a dielectric substrate; a magnetic substrate, a space being provided between the magnetic substrate and the dielectric substrate; and an electrode provided between the dielectric substrate and the magnetic substrate. The electrode is relatively near to the dielectric substrate side at a predetermined position, and is relatively near to the magnetic substrate side at another position, which is different from the predetermined position.

Consequently, a desired distance can be set from the inductance element, the capacitance element, the resistor, the transmission line portion, and the like formed by the electrode pattern to the dielectric substrate or the magnetic substrate, making it possible to design the degree of coupling between these elements and the dielectric and magnetic substrates, enabling the characteristics of these elements to be precisely designed.

For instance, when ferrite is used as the magnetic substrate, it has a dielectric constant of around 10 to 15, a dielectric loss tangent of $1\times10^{-3}$ to $1\times10^{-4}$, and permeability of 1 or more. On the other hand, generally used dielectric substrates have a dielectric constant of around 10 to 100, a dielectric loss tangent of $5\times10^{-4}$ to $1\times10^{-5}$, and permeability of 1. For this reason, a greater practical dielectric constant and higher capacitance can be obtained when the capacitance element of the electrode is provided near to the dielectric substrate. Furthermore, when the electrode is near to the dielectric substrate, the same capacitance can be obtained with a smaller capacitance element. Further, a transmission line portion with low transmission loss can be obtained by providing the electrode near to a dielectric substrate having a small dielectric loss tangent. Moreover, greater practical permeability and higher inductance can be obtained when the inductance element of the electrode is provided near to the magnetic substrate. Furthermore, when the electrode is near to the magnetic substrate, the same inductance can be obtained with a smaller inductance element.

Preferably, the electrode of the complex circuit board should be very close (i.e., adjacent or in contact with) or near (i.e., spaced a predetermined distance from) the dielectric substrate side at a predetermined position, and very close or near to the magnetic substrate side at another position which is different from the predetermined position.

In some embodiments, the electrode and the corresponding substrate may optionally be separated and simultaneously adhered to each other by an adhesive layer.

With this arrangement, the coupling between the electrode and the dielectric substrate is strengthened by placing the electrode near or very close to the dielectric substrate, and the coupling between the electrode and the magnetic substrate is strengthened by placing the electrode near or very close to the magnetic substrate.

Furthermore, the complex circuit board may comprise a substance having a lower dielectric constant than the dielectric substrate. The substance of low dielectric constant is provided between the electrode near to the magnetic substrate side and the dielectric substrate.

This weakens the coupling between the electrode near to the magnetic substrate side and the dielectric substrate, ensuring that the effects of providing the electrode near to the magnetic substrate are not lost.

In another arrangement of the complex circuit board of the present invention, the electrode near to the dielectric substrate side and the electrode near to the magnetic substrate side may be joined together in a single body.

As a consequence, there is no need to connect the electrode on the dielectric substrate to the electrode on the magnetic substrate, eliminating problems of reduced reliability and time-consuming manufacturing processes which such connection causes.

In another arrangement, a substrate having electrodes on its top and bottom faces, the electrodes being connected by a through hole, may be provided between the dielectric substrate and the magnetic substrate.

This enables the complex circuit board to be made easily by affixing the dielectric substrate to the magnetic substrate with the substrate provided with electrodes clasped therebetween.

Alternatively, a capacitance element is provided to the electrode near to the dielectric substrate side, and an inductance element is provided to the electrode near to the magnetic substrate side.

Consequently, the capacitance element can be made smaller than conventional elements of the same inductance, and the inductance element can be made smaller than conventional elements of the same inductance.

With this constitution, the dielectric substrate and the magnetic substrate need only be provided at the portions where they are needed, avoiding wasteful use of the dielectric substrate and the magnetic substrate.

Furthermore, a nonreciprocal circuit device of the present invention may comprise multiple intersecting inductance element portions, a capacitance element portion connected thereto, and a magnet for applying a dc magnetic field.

Consequently, the inductance element portion of the nonreciprocal circuit device is near to the magnetic substrate, and the capacitance element portion is near to the dielectric substrate, enabling the nonreciprocal circuit device to be miniaturized.

A resonator of the present invention may comprise the complex circuit board described above, wherein the electrodes provided between the dielectric substrate and the magnetic substrate form a capacitance element and an inductance element, thereby forming a resonator.

Consequently, the resonator can be miniaturized by, for instance, providing the inductance element of the resonator near to the magnetic substrate, and providing the capacitance element near to the dielectric substrate.

Furthermore, a filter of the present invention may comprise the resonator described above, and input/output connection means.

Consequently, the filter can be miniaturized by, for instance, providing the inductance element of the filter near to the magnetic substrate, and providing the capacitance element near to the dielectric substrate.

A duplexer of the present invention may comprise at least two filters, input/output connection means connected to each of the filters, and antenna connection means connected jointly to the filters. In this case, at least one of the filters may comprise the filter of the present invention described above.

Consequently, the duplexer can be miniaturized by, for instance, providing the inductance element of the duplexer near to the magnetic substrate, and providing the capacitance element near to the dielectric substrate.

Furthermore, a communications device of the present invention may comprise the duplexer described above, a circuit for transmitting, connected to at least one input/output connection means of the duplexer, a circuit for receiving, connected to at least one input/output connection means other than the input/output connection means connected to the circuit for transmitting, and an antenna connected to the antenna connection means of the duplexer.

Consequently, the communications device can be miniaturized by, for instance, providing the inductance element of the communications device near to the magnetic substrate, and providing the capacitance element near to the dielectric substrate.

Furthermore, a circuit module of the present invention may have at least one functional element comprising the complex circuit board of the present invention described above.

Consequently, the circuit module can be miniaturized by, for instance, providing the inductance element of the circuit module near to the magnetic substrate, and providing the capacitance element near to the dielectric substrate.

Furthermore, a nonreciprocal circuit device of the present invention may comprise a dielectric substrate, a magnetic substrate, a space being provided between the magnetic substrate and the dielectric substrate, an electrode provided between the dielectric substrate and the magnetic substrate, the electrode comprising a resonator portion and a transmission line portion, and a magnet for applying a dc magnetic field. The transmission line portion of the electrode is relatively near to the dielectric substrate side, and the resonator portion of the electrode is relatively near to the magnetic substrate side.

Consequently, the transmission line portion of the electrode is near to the dielectric substrate, reducing propagation loss, and enabling the device to be made smaller than conventional devices having the same characteristics. Furthermore, since the resonator portion of the electrode is near the magnetic substrate, it is more strongly coupled with the magnetic substrate, improving the nonreciprocity of the device.

Preferably, in the specific form of the invention set forth above, the transmission line portion of the electrode is very close or near to the dielectric substrate side, and the resonator portion of the electrode is very close or near to the magnetic substrate side.

Consequently, the electrode which is very close or near to the dielectric substrate side is more strongly coupled thereto, and the electrode which is very close or near to the magnetic substrate side is more strongly coupled thereto.

In yet another arrangement, a substance having a lower dielectric constant than the dielectric substrate may be provided between the dielectric substrate and the resonator portion of the electrode near to the dielectric substrate side.

Consequently, it is possible to weaken the coupling between the dielectric substrate and the electrode near to the magnetic substrate side, ensuring that the effects of providing the electrode near to the magnetic substrate are not lost.

In yet another arrangement of the nonreciprocal circuit device, a substrate having electrodes on its top and bottom faces, the electrodes being connected by a through hole, may be provided between the dielectric substrate and the magnetic substrate.

Consequently, the complex circuit board can be made easily by affixing the dielectric substrate to the magnetic substrate with the substrate provided with electrodes clasped therebetween.

Consequently, the dielectric substrate and the magnetic substrate need only be provided at the portions where they are needed, avoiding wasteful use of the dielectric substrate and the magnetic substrate.

Furthermore, a communications device of the present invention may comprise the nonreciprocal circuit device described above, a circuit for transmitting, a circuit for receiving, and an antenna.

Consequently, the transmission line portion of the nonreciprocal circuit device is near to the dielectric substrate side, and the resonator portion is near to magnetic substrate side, improving the characteristics of the communications device and enabling it to be miniaturized.

Furthermore, the present invention may provide a method for manufacturing a complex circuit board comprising the steps of providing a dielectric substrate; providing a film of low dielectric constant, comprising a substance having a lower dielectric constant than the dielectric substrate, on said dielectric substrate; providing an electrode pattern on the dielectric substrate which the film of low dielectric constant has been provided on; and affixing a magnetic substrate to the dielectric substrate on which the electrode pattern has been provided.

Consequently, the electrodes of the complex circuit board, which has an electrode pattern near to the dielectric substrate or the magnetic substrate at a predetermined position, can be provided in a single process.

Furthermore, a method for manufacturing a complex circuit board may comprise the steps of providing a dielectric substrate; providing a magnetic substrate; providing an electrode pattern on top and bottom faces of a substrate of low dielectric constant having a lower dielectric constant than the dielectric substrate; providing a through hole running between the electrode on the top face and the electrode on the bottom face; and affixing the dielectric substrate to the magnetic substrate so as to clasp the substrate of low dielectric constant therebetween.

Consequently, a complex circuit board having an electrode pattern near to the dielectric substrate or the magnetic substrate at a predetermined position can be easily manufactured by affixing the dielectric substrate to the magnetic substrate, with the substrate provided with electrodes clasped therebetween.

Yet another method for manufacturing a complex circuit board may comprise the steps of providing a dielectric substrate; providing an electrode pattern on the dielectric substrate; providing a magnetic substrate; providing an electrode pattern on the magnetic substrate; arranging the dielectric substrate and the magnetic substrate so that their faces provided with the electrode patterns are facing each other, and so that the electrode patterns are facing each other at a predetermined connection portion, and connecting the electrode pattern of the dielectric substrate to the electrode pattern of the magnetic substrate at the predetermined connection portion.

Consequently, the electrode pattern can be moved near to the dielectric substrate side at a predetermined position, and the electrode pattern at other positions can be moved near to the magnetic substrate, using a conventional flip-chip mounting technique.

Yet another method for manufacturing a nonreciprocal circuit device may comprise the steps of providing a dielectric substrate; providing a film of low dielectric constant, comprising a substance having a lower dielectric constant than the dielectric substrate, on the dielectric substrate; providing an electrode pattern such that a resonator portion is formed at the portion of the dielectric substrate where the film of low dielectric constant is provided, and a transmission line portion is formed at other portions thereof; affixing a magnetic substrate to the dielectric substrate which the electrode pattern has been provided; and providing a magnet for applying a dc magnetic field.

Consequently, a nonreciprocal circuit device having an electrode pattern provided near to the dielectric substrate or the magnetic substrate at a predetermined position can be manufactured in a single process.

Yet another method for manufacturing a nonreciprocal circuit device may comprise the steps of providing a dielectric substrate; providing a magnetic substrate; providing an electrode pattern on top and bottom faces of a substrate of low dielectric constant having a lower dielectric constant than the dielectric substrate; providing a through hole running between the electrode on the top face and the electrode on the bottom face; affixing the dielectric substrate to the magnetic substrate so as to clasp the substrate of low dielectric constant therebetween, and so that the magnetic substrate is on the resonator portion side of the electrode pattern, and the dielectric substrate is on the transmission line portion side of the electrode pattern; and providing a magnet for applying a dc magnetic field.

Consequently, a nonreciprocal circuit device having an electrode pattern provided near to the dielectric substrate or the magnetic substrate at a predetermined position can be easily manufactured by affixing the dielectric substrate to the magnetic substrate, with the substrate provided with the electrodes clasped therebetween.

Yet another method for manufacturing a nonreciprocal circuit device may comprise the steps of providing a dielectric substrate; providing an electrode pattern forming a transmission line portion on the dielectric substrate; providing a magnetic substrate; providing an electrode pattern forming a resonator portion on the magnetic substrate; arranging the dielectric substrate and the magnetic substrate so that their faces provided with the electrode patterns are facing each other, and so that the electrode patterns are facing each other at a predetermined connection portion, connecting the electrode pattern of the dielectric substrate to the electrode pattern of the magnetic substrate at the predetermined connection portion, and providing a magnet for applying a dc magnetic field.

Consequently, the electrode pattern can be moved near to the dielectric substrate side at a predetermined position, and the electrode pattern at other positions can be moved near to the magnetic substrate, using a conventional flip-chip mounting technique.

These and other features and advantages will be understood from the following detailed description of embodiments of the invention, with reference to the drawings, in which like references denote like elements and parts.

DESCRIPTION OF EMBODIMENTS OF THE INVENTION

Figure 1:
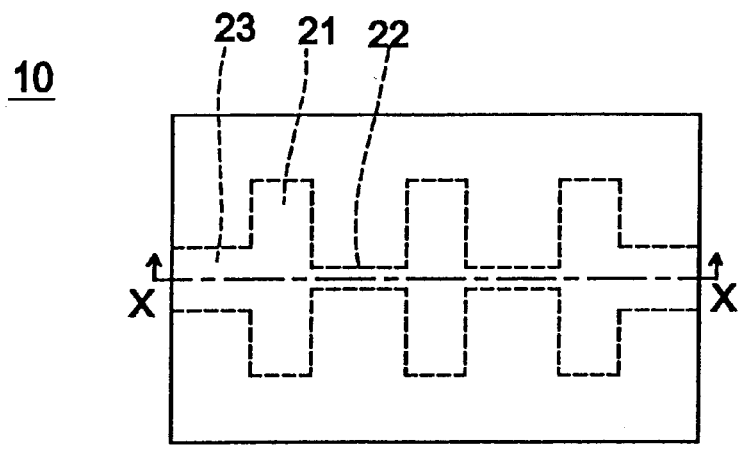
FIG. 1 is a plan view of a complex circuit board according to an embodiment of the present invention.

A complex circuit board according to a preferred embodiment of the present invention will be described below with reference to FIGS. 1 and 2. FIG. 1 is a plan view of a complex circuit board of the present invention, and FIG. 2 is a cross-sectional view taken along the line X—X of FIG. 1.

Figure 2:
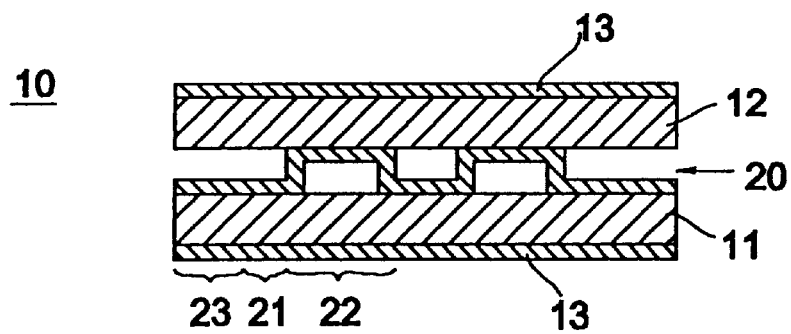
FIG. 2 is a cross-sectional view taken along the line X—X of FIG. 1.

As shown in FIGS. 1 and 2, the complex circuit board 10 of the present invention comprises a dielectric substrate 11, a magnetic substrate 12, and an electrode pattern 20 clasped therebetween. The electrode pattern 20 comprises a capacitance element portion 21, an inductance element portion 22, a transmission line portion 23, and the like. Ground electrodes 13 are provided on outside faces of the dielectric substrate 11, comprising for instance $CaTiO_3$, and the magnetic substrate 12, comprising ferrite. The complex circuit board 10 having the constitution shown in FIG. 1 functions here as a low-pass filter.

As shown in FIG. 2, in the complex circuit board 10 of the present invention, the capacitance element portion 21 of the electrode pattern 20 is very close to the dielectric substrate 11, and the inductance element portion 22 is very close to the magnetic substrate 12. In this way, the capacitance of the capacitance element portion 21 can be increased by providing the capacitance element portion 21 very close to the dielectric substrate 11. Therefore, the complex circuit board 10 can be made smaller than a conventional complex circuit board having the same capacitance. Furthermore, when the inductance element portion 22 is provided very close to the magnetic substrate 12, the coupling of the inductance element portion 22 to the dielectric substrate 11 is weakened, increasing its inductance. Therefore, the complex circuit board 10 can be smaller than a conventional complex circuit board having the same inductance. In addition, the distances from the transmission line portion 23 and a resistor or the like (not shown in the diagram) to the dielectric substrate 11 and the magnetic substrate 12 affect their transmission loss. Therefore, the characteristics of the transmission line portion 23 and the resistor can be precisely designed depending on where they are positioned between the dielectric substrate 11 and the magnetic substrate 12, whereby required characteristics can be achieved easily.

Next, a second embodiment of the complex circuit board of the present invention will be explained based on FIG. 3. Like members to those in the preceding embodiment are designated by like reference characters, and detailed explanation thereof is omitted.

Figure 3:
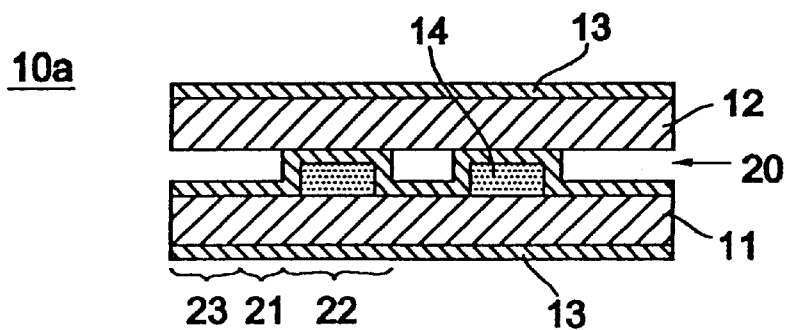
FIG. 3 is a cross-sectional view of a complex circuit board according to a second embodiment of the present invention.

As shown in FIG. 3, the complex circuit board 10a of the present embodiment comprises a dielectric substrate 11, a magnetic substrate 12, an electrode pattern 20 clasped therebetween, and a substance having a low dielectric constant 14 clasped between the electrode pattern 20 and the dielectric substrate 11. Here, the substance having a low dielectric constant 14 comprises a substance having a lower dielectric constant than the dielectric substrate 11. Preferably, the substance 14 should also have a lower dielectric constant than the magnetic substrate 12. The substance having a low dielectric constant 14 is clasped between the dielectric substrate 11 and the electrode pattern 20 at the same position as the inductance element portion 22. The substance having a low dielectric constant 14 makes the coupling between the inductance element portion 22 and the dielectric substrate 11 weaker, compared with a case (not shown) in which, for instance, a protrusion is provided in the dielectric substrate 11 to move the inductance element portion 22 nearer to the magnetic substrate 12. That is, the substance having a low dielectric constant 14 prevents the effect of the coupling with the magnetic substrate 12 from being reduced by the coupling with the dielectric substrate 11 more effectively than if, for instance, a protrusion were provided in the dielectric substrate 11 to move the inductance element portion 22 nearer to the magnetic substrate 12.

In the above embodiment, the electrode pattern clasped between the dielectric substrate and the magnetic substrate was very close in one direction to either the dielectric substrate or the magnetic substrate, but alternatively, the inductance element portion may be provided near to the magnetic substrate by, for instance, inserting the substance having a low dielectric constant between the inductance element portion and the magnetic substrate, or by any other suitable method. This will be explained based on results of a simulation.

Figure 4:
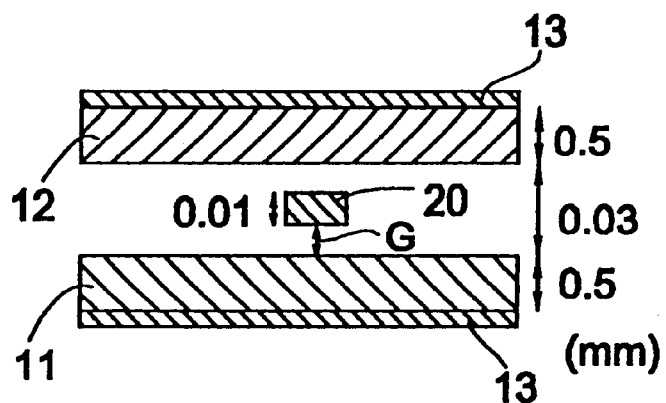
FIG. 4 is a conceptual view showing a simulation method.
Figure 5:
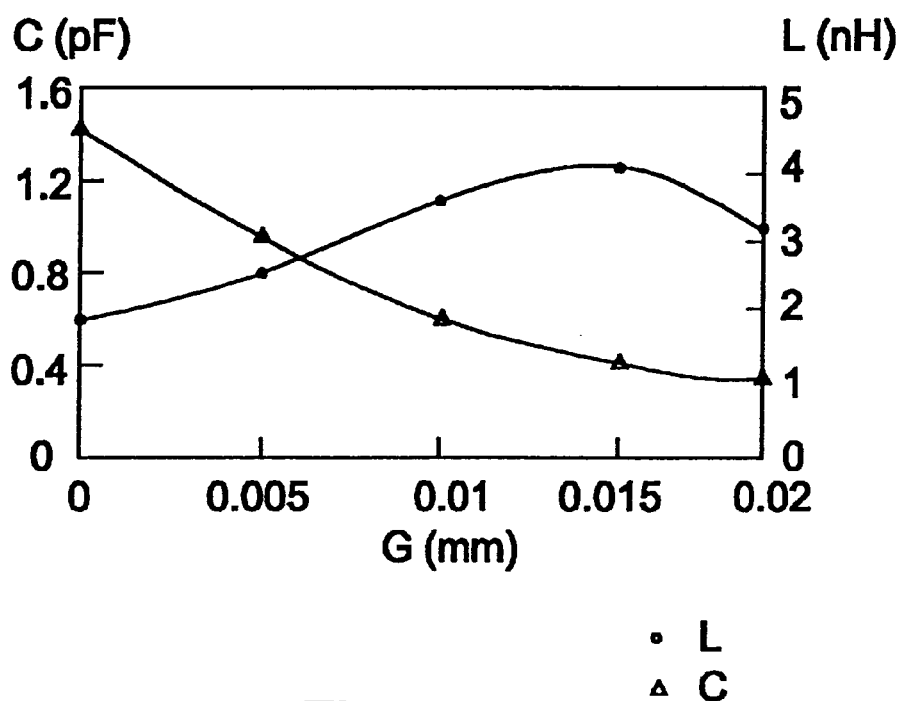
FIG. 5 is a diagram showing relationships between a gap and capacitance, and the gap and inductance.

FIG. 4 is a conceptual diagram showing a electrode pattern 20 provided between the dielectric substrate 11 and the magnetic substrate 12, which have a space therebetween. FIG. 5 shows simulation results illustrating the relationship between the gap G between the electrode pattern 20 and the dielectric substrate 11 and the inductance L, and the relationship between the gap G and the capacitance C. The dielectric substrate 11 has a thickness of 0.5 mm, a dielectric constant of approximately 90, and permeability of approximately 1. The magnetic substrate 12 has a thickness of 0.5 mm, a dielectric constant of approximately 15 and permeability of approximately 3. Furthermore, the space between the dielectric substrate 11 and the magnetic substrate 12 is 0.03 mm and the thickness of the electrode pattern 20 is 0.01 mm. In FIG. 5, the symbol Δ represents the capacitance C, and the symbol O represents the inductance L. As shown in FIG. 5, the capacitance C is greater when the electrode pattern 20 is very close to the dielectric substrate 11, and the inductance L reaches its maximum when the electrode pattern 20 is disposed at 0.005 mm from the magnetic substrate 12, that is, the gap G is 0.015 mm as shown in FIG. 5. That is, it is better for the inductance element portion to be provided near (spaced a predetermined distance from) the magnetic substrate 12 rather than very close to (adjacent or in contact with) it.

Figure 6:
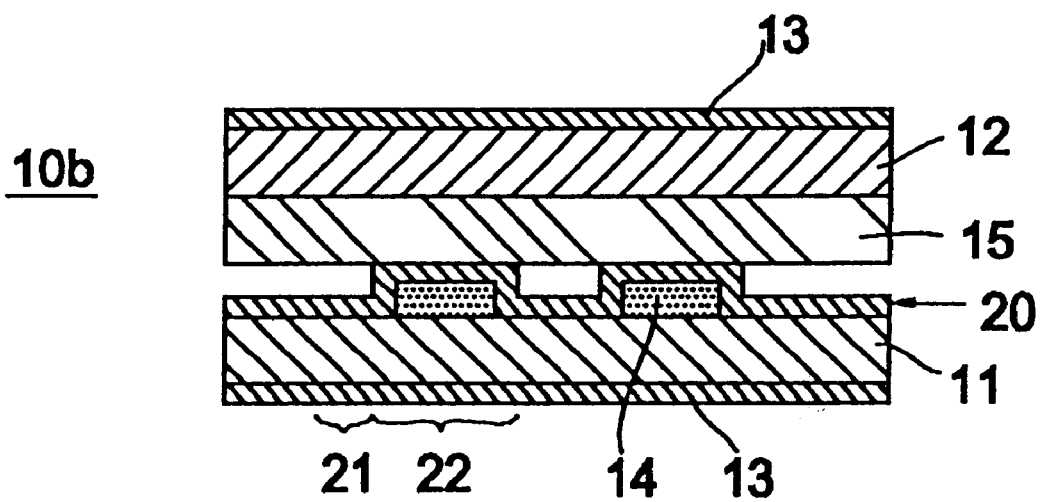
FIG. 6 is a cross-sectional view of a modification according to an embodiment of the present invention.

In these embodiments, the electrode pattern clasped between the dielectric substrate and the magnetic substrate is provided near or very close to the dielectric substrate, but the constitution is not limited to this. For instance, as shown in the complex circuit board 10b of FIG. 6, the entire electrode pattern 20 is provided relatively closer to the dielectric substrate 11 than to the magnetic substrate 12, by inserting a substrate body 15 having a low dielectric constant or the like between the magnetic substrate 12 and the electrode pattern 20. In this embodiment, the inductance element portion 22 is relatively nearer to the magnetic substrate 12 than the capacitance element portion 21. Such an arrangement also achieves the effects of the present invention.

Next, a method for manufacturing the complex circuit board of the present invention will be explained.

Firstly, a ground electrode is provided on one side of a dielectric substrate, and a film having a low dielectric constant, such as epoxy resin or polyimide resin, is provided at a position on the dielectric substrate where the inductance element is to be provided. Thereafter, an electrode pattern, comprising a capacitance element, an inductance element, a transmission line, and the like, is formed by plating or sputtering on the dielectric substrate provided with the film having a low dielectric constant. Then, a magnetic substrate having a ground electrode on one face is attached, thereby forming the complex circuit board of the second embodiment. Using this manufacturing method, the electrode pattern can be provided in one process, enabling the complex circuit board to be made more easily than in conventional connection methods using a connection electrode.

This embodiment stresses the importance of the level of contact or spacing between the dielectric substrate and the electrode pattern, and describes an example where the electrode pattern is formed on the dielectric substrate, but alternatively, the electrode pattern may be formed on the magnetic substrate. When the manufacturing method explained in this embodiment is used, the contact layer or adhesive layer between the electrode pattern and the magnetic substrate itself becomes a layer having a low dielectric constant, making it possible to provide an appropriate gap at the inductance element portion between the electrode pattern and the dielectric substrate. Further, although the above embodiment describes an example where only one layer of film having a low dielectric constant is provided, multiple layers of film having a low dielectric constant can be provided at certain places, making it possible to provide an appropriate distance between each of the various elements of the electrode pattern and the dielectric substrate and the magnetic substrate, thereby enabling the characteristics of the complex circuit board to be designed precisely.

Figure 7:
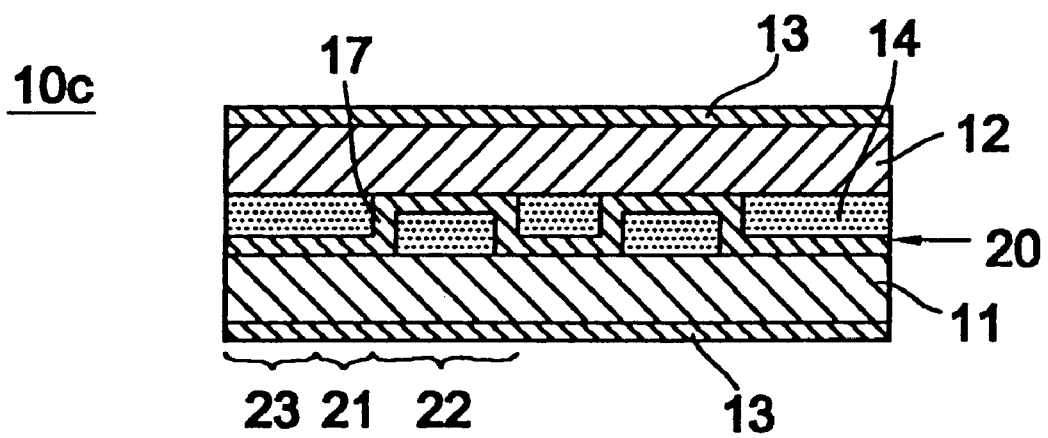
FIG. 7 is a cross-sectional view of another embodiment of the present invention.

Yet another manufacturing method will be explained in connection with FIG. 7. Firstly, electrode patterns are provided on top and bottom faces of a substrate having a low dielectric constant, such as a resin substrate or the like. Here, for instance, the electrode pattern forming the inductance element portion is provided on one face, the electrode pattern forming the capacitance element portion and transmission line is provided on the other face, and electrical connection between the electrode patterns of the top and bottom faces is achieved by providing through holes 17. Then, the substrate having a low dielectric constant, with the electrode pattern provided thereon, is inserted between a magnetic substrate and a dielectric substrate which have a ground electrode on one face thereof. By this manufacturing method, the complex circuit board 10c shown in FIG. 7 is obtained.

Figure 8:
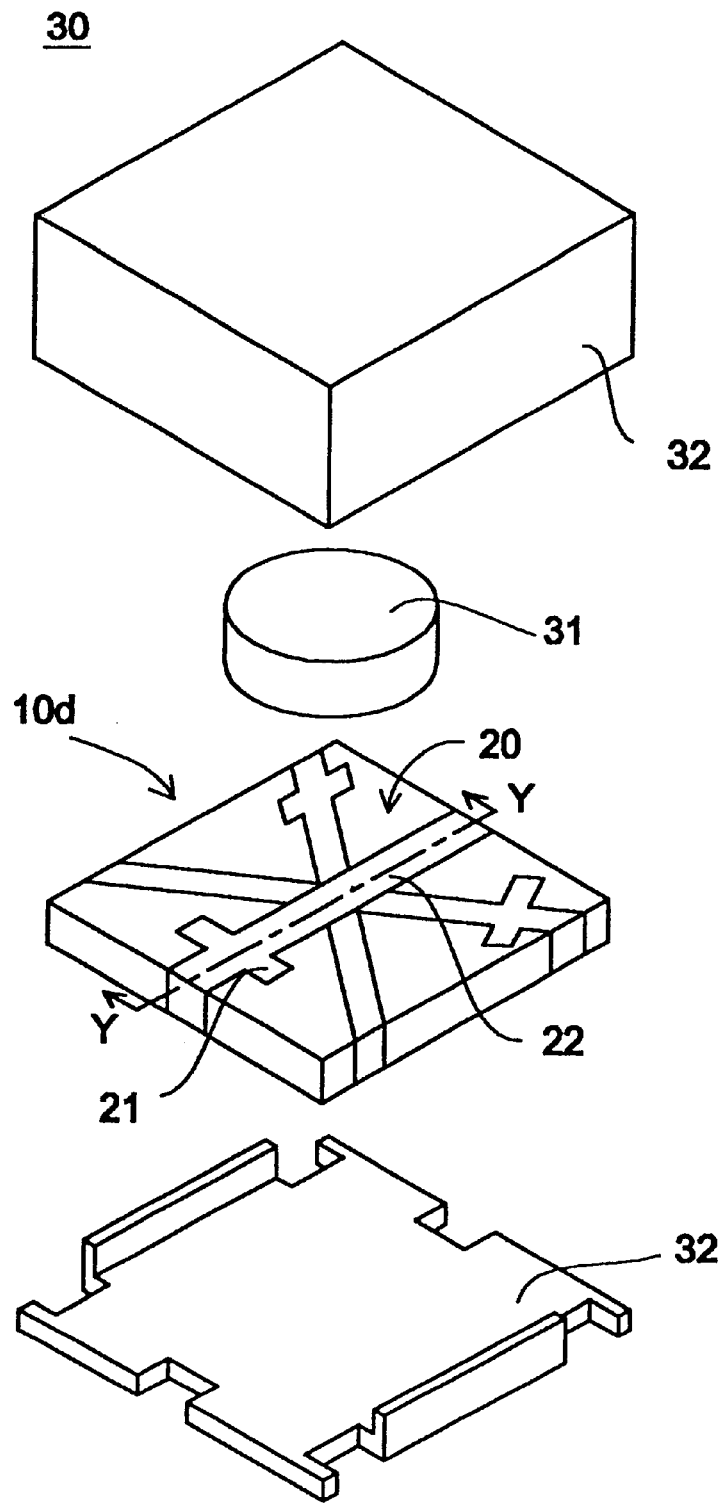
FIG. 8 is an exploded perspective view of a nonreciprocal circuit device according to an embodiment of the present invention.

Next, a nonreciprocal circuit device according to an embodiment of the present invention will be explained using FIGS. 8 and 9. FIG. 8 is an exploded perspective view of the nonreciprocal circuit device of the present invention, and FIG. 9 is a cross-sectional view taken along the line Y—Y of the complex circuit board portion of FIG. 8.

Figure 9:
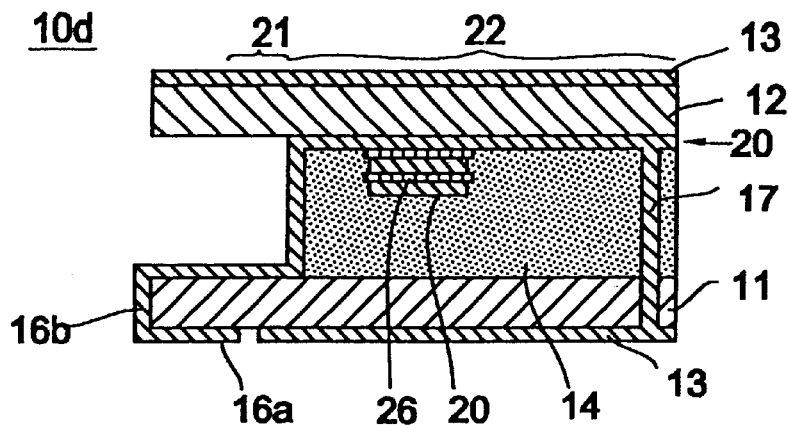
FIG. 9 is a cross-sectional view taken along the line Y—Y of FIG. 8.

As shown in FIGS. 8 and 9, the nonreciprocal circuit device 30 of the present invention comprises a complex circuit board portion 10d, a magnet 31 for applying a dc magnetic field, and a case 32 for containing these. The complex circuit board portion 10d comprises a dielectric substrate 11, a magnetic substrate 12 comprising a ferrite or the like, and a central electrode 20 clasped therebetween. The central electrode 20 comprises three electrodes intersecting each other at angles of 120°. One end of the central electrode 20 connects to an input/output electrode side and the other connects to ground.

The central electrode 20 is for instance formed by providing a film 14 having a low dielectric constant on the dielectric substrate 11 at a position corresponding to the position of the inductance element portion 22 of the central electrode 20, which has a ground electrode 13 provided on its bottom face, and plating or the like is carried out to obtain a first central electrode 20 comprising the inductance element portion 22 and a capacitance element portion 21 for matching. Thereafter, second and third central electrodes 20 are formed using the same method as the first central electrode 20, and an insulating film 26 is clasped therebetween. Then, the magnetic substrate 12 having a ground electrode 13 is affixed to the dielectric substrate 11, which the central electrode 20 is provided on, thereby completing the complex circuit board portion 10d. One end of each of the three central electrodes 20 is connected by a connection electrode 16b or the like to an input/output electrode 16a, which is insulated from the ground electrode 13 on the bottom face of the dielectric substrate 11. The other ends of the three central electrodes are connected by a through hole 17 or the like to the ground electrode 13 on the bottom face of the dielectric substrate 11.

The complex circuit board portion 10d formed in this way is placed inside the case 32 together with the magnet 31, which is provided on top of a magnetic substrate 12, thereby completing the nonreciprocal circuit device 30.

In the nonreciprocal circuit device 30, since the inductance element portion 22 is provided on top of the film having a low dielectric constant 14 on the dielectric substrate 11, and the capacitance element portion 21 is provided on the dielectric substrate 11, the inductance element portion 22 is near to the magnetic substrate 12 side, and the capacitance element portion 21 is near to the dielectric substrate 11 side. Therefore, the inductance element portion 22 and the capacitance element portion 21 are both smaller than in a conventional nonreciprocal circuit device having the same characteristics, so that the nonreciprocal circuit device 30 itself can be miniaturized.

Figure 10:
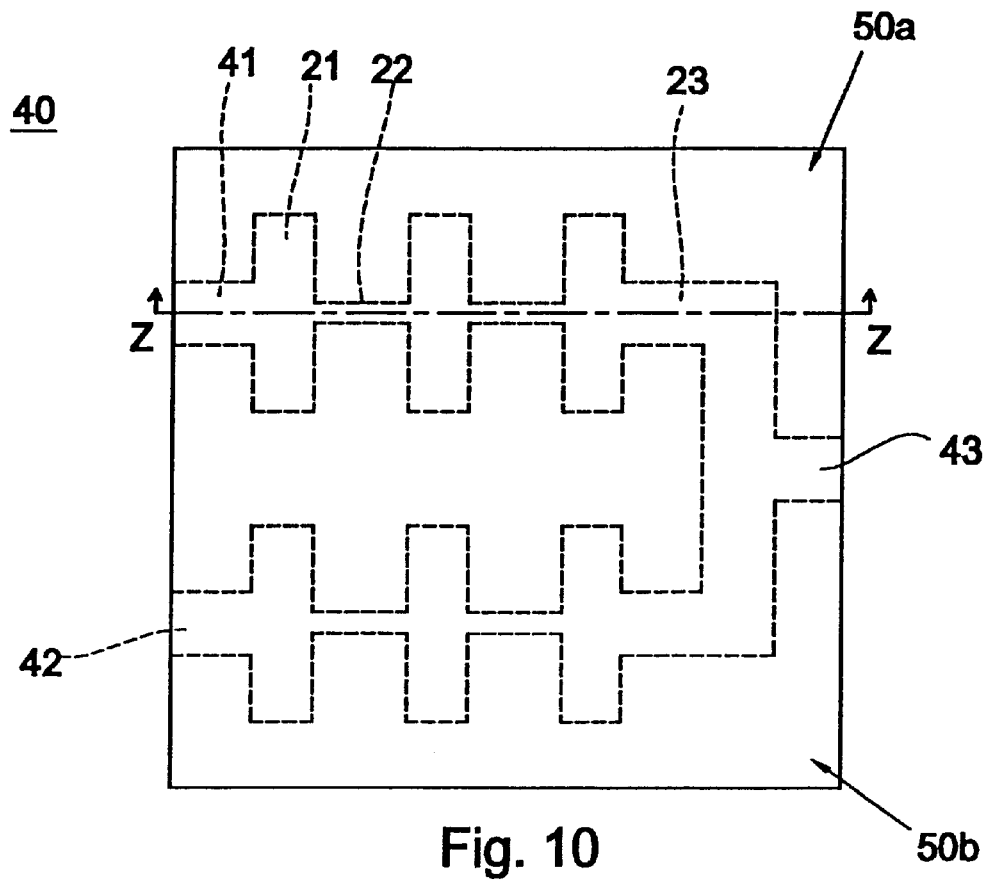
FIG. 10 is a plan view of a duplexer according to an embodiment of the present invention.

Next, a duplexer of the present invention will be explained based on FIGS. 10 and 11. FIG. 10 is a plan view of a duplexer of the present invention, and FIG. 11 is a cross-sectional view taken along the line Z—Z of FIG. 10.

Figure 11:
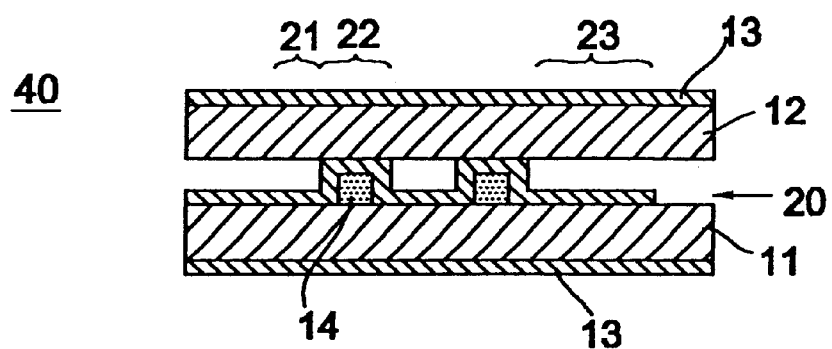
FIG. 11 is a cross-sectional view taken along the line Z—Z of FIG. 10.

As shown in FIGS. 10 and 11, the duplexer 40 of the present invention comprises a first filter portion 50a, comprising a stripline filter, and a second filter portion 50b, comprising another stripline filter. The filter forming the first filter portion 50a functions as a bandpass filter for transmitting. The filter forming the second filter portion 50b comprises a resonator having a different resonant frequency than the first filter portion 50a, and functions as a bandpass filter for receiving. An input/output connection 41 of the first filter portion 50a connects to an external circuit for transmitting, and an input/output connection 42 of the second filter portion 50b connects to an external circuit for receiving. Furthermore, another input/output connection of the first filter portion 50a and another input/output connection of the second filter portion 50b are integrated as an antenna connection 43, which connects to an external antenna.

The duplexer 40 of this constitution functions as a bandpass duplexer, wherein the first filter portion 50a allows signals at a predetermined frequency to pass, and the second filter portion 50b allows signals at a different frequency than the aforementioned frequency to pass.

In the duplexer 40 of the present embodiment, since the inductance element portion 22 is provided on top of the film having a low dielectric constant 14 on the dielectric substrate 11, and the capacitance element portion 21 is provided on the dielectric substrate 11, the inductance element portion 22 is near the magnetic substrate 12, and the capacitance element portion 21 is near the dielectric substrate 11. Therefore, the inductance element portion 22 and the capacitance element portion 21 can both be smaller than in a conventional duplexer having the same characteristics, so the filters can be miniaturized, and consequently the duplexer 40 itself can be miniaturized.

Figure 12:
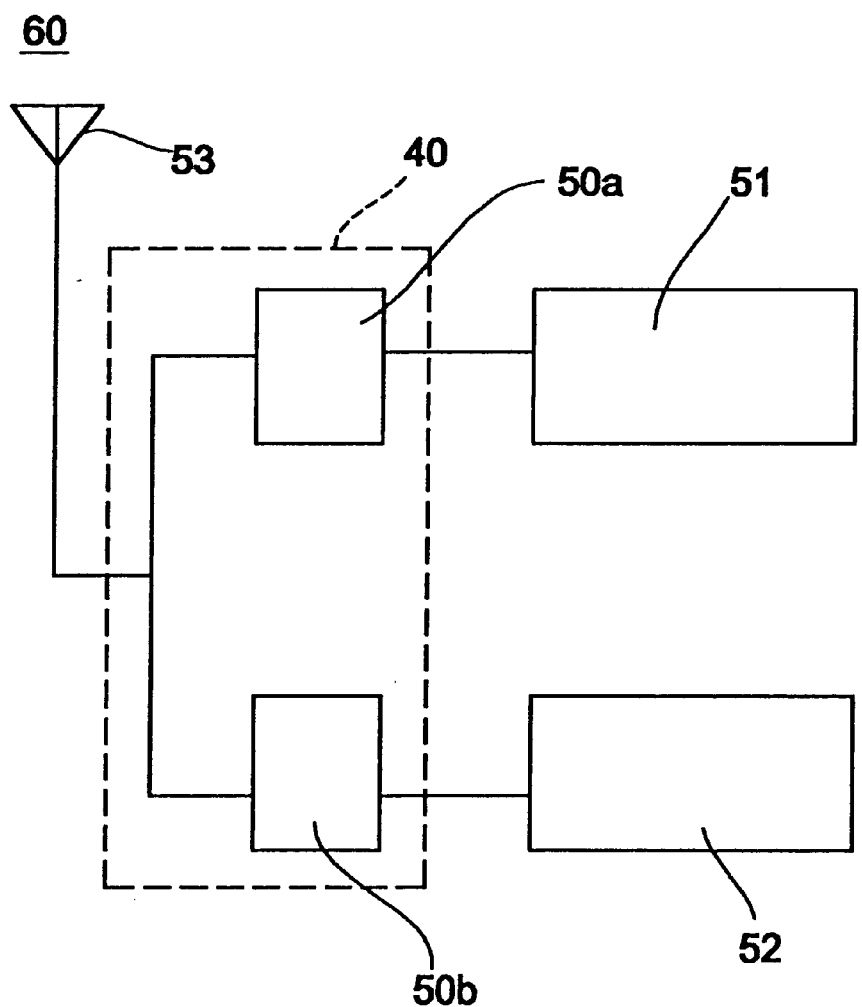
FIG. 12 is a schematic view of a communications device according to an embodiment of the present invention.

Furthermore, a communications device 60 of the present embodiment will be explained based on FIG. 12. FIG. 12 shows a schematic view of the communications device of the present embodiment.

As shown in FIG. 12, the communications device 60 of the present embodiment comprises a duplexer 40, a circuit for transmitting 51, a circuit for receiving 52, and an antenna 53. The duplexer 40 used here is that described in the previous embodiment. The input/output connection connecting to the first filter portion 50a of FIG. 10 is connected to the circuit for transmitting 51, and the input/output connection connecting to the second filter portion 50b is connected to the circuit for receiving 52. Furthermore, the antenna connection 43 is connected to an antenna 53.

In the communications device 60 of the present embodiment, since the inductance element portion is provided on top of the film having a low dielectric constant on the dielectric substrate, and the capacitance element portion is provided on the dielectric substrate, the inductance element portion is near the magnetic substrate, and the capacitance element portion is near the dielectric substrate. Therefore, since the inductance element portion and the capacitance element portion are both smaller than in a conventional communications device having the same characteristics, the communications device itself can be miniaturized.

Figure 13:
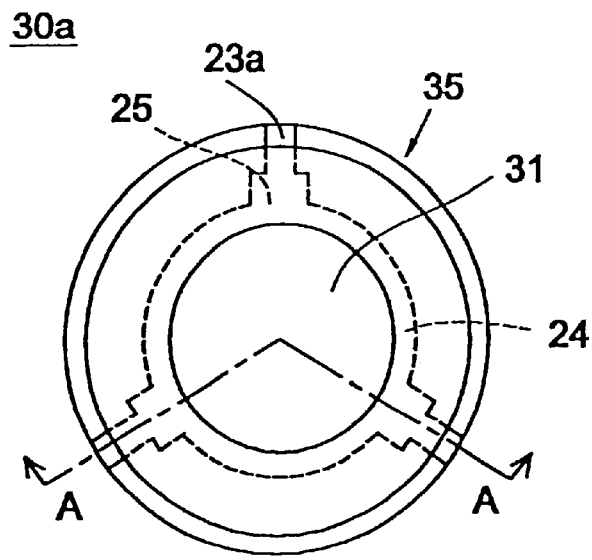
FIG. 13 is a plan view of another nonreciprocal circuit device according to an embodiment of the present invention.

Next, a nonreciprocal circuit device of the present invention different from that described above will be explained based on FIG. 13. FIG. 13 is a plan view of another nonreciprocal circuit device of the present invention, and FIG. 14 is a cross-sectional view taken along the line A—A of FIG. 13.

Figure 14:
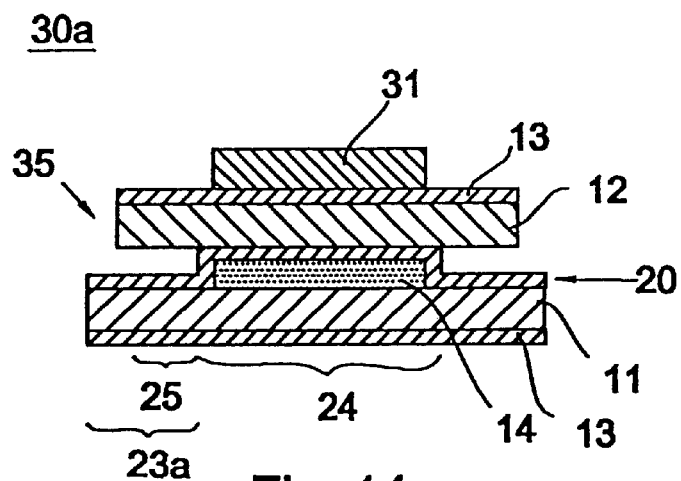
FIG. 14 is a cross-sectional view taken along the line A—A of FIG. 13.

As shown in FIGS. 13 and 14, the nonreciprocal circuit device 30a of the present embodiment comprises a nonreciprocal circuit device main body 35 and a magnet 31, which is provided on top of the nonreciprocal circuit device main body 35, for applying a dc magnetic field thereto. The nonreciprocal circuit device main body 35 comprises a dielectric substrate 11 and a magnetic substrate 12 each having a ground electrode 13 on one face thereof, and an electrode pattern 20 clasped therebetween. The electrode pattern 20 comprises a resonator portion 24 in the center, and transmission line portions 23*a* intersecting each other at angles of 120°. Furthermore, matching circuit portions 25, for matching the resonator portion 24 and the transmission line portions 23*a*, are provided to the transmission line portions 23*a*.

Figure 15:
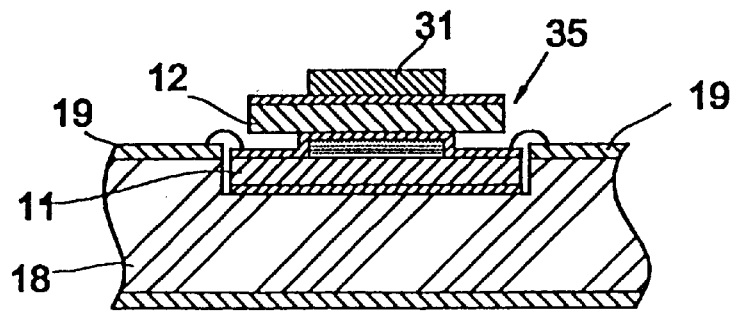
FIG. 15 is a cross-sectional view showing the nonreciprocal circuit device of FIG. 13 provided in a dip of a substrate.

As for instance shown in FIG. 15, the nonreciprocal circuit device main body 35 of this constitution is arranged so that the dielectric substrate 11 faces downwards in a recess provided in a substrate 18, and a magnet 31 is provided on top of the magnetic substrate 12 at a position corresponding to the position of the resonator portion 24 of the electrode pattern 20. Then, the ends of the transmission line portions 23*a* are connected by wire bonding (as shown) or connection electrodes or the like to electrode lines 19, provided on the substrate 18. The magnetic substrate 12 need only be disposed on at least the resonator portion 24 of the electrode pattern 20, and by using a magnetic substrate 12 which is smaller in size than the dielectric substrate 11, the ends of the transmission line portions 23*a* can be exposed at the surface and connected to the electrode lines 19 of the substrate 18.

To obtain the nonreciprocal circuit device of the present embodiment, a film 14 having a low dielectric constant is first provided on the dielectric substrate 11 at a position corresponding to the resonator portion 24 of the electrode pattern 20. Then, the electrode pattern 20, comprising the resonator portion 24 and the transmission line portions 23*a*, is provided on the dielectric substrate 11 comprising the film 14 having a low dielectric constant, and finally the magnetic substrate 12 is affixed thereto. Using this method, the electrode pattern 20 can be provided in a single process, enabling the nonreciprocal circuit device 30*a* to be manufactured easily.

Furthermore, another method for forming the nonreciprocal circuit device may be envisaged using a constitution such as that shown above in FIG. 7. That is, an electrode pattern constituting a resonator portion is provided on one face of a substrate having a low dielectric constant, and an electrode pattern constituting a transmission line portion is provided on the other face. Then, the electrode patterns on the top and bottom faces are connected together by a through hole or the like, a magnetic substrate is affixed to the resonator portion side, and a dielectric substrate is affixed to the transmission line portion side. This method similarly makes it possible to provide the electrode pattern in a single process, enabling the nonreciprocal circuit device to be manufactured easily.

In the embodiment of FIGS. 13–15, a substance of low dielectric constant 14 is provided between the resonator portion 24 of the electrode pattern 20 and the dielectric, substrate 11 to increase the distance between the resonator portion 24 and the dielectric substrate 11, thereby weakening the coupling between the resonator portion 24 and the dielectric substrate 11 and improving the nonreciprocity of the nonreciprocal circuit device 30*a* more than if, for instance, a protrusion (not shown) were provided in the dielectric substrate 11 to arrange the resonator portion 24 nearer to the magnetic substrate 12.

Figure 16:
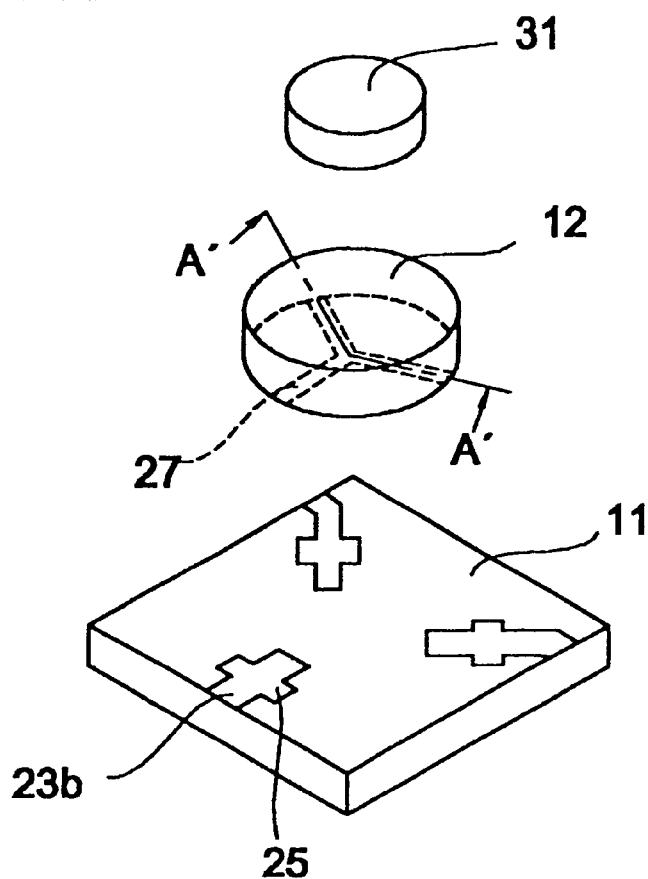
FIG. 16 is an exploded perspective view of yet another nonreciprocal circuit device according to an embodiment of the present invention.

Yet another embodiment of the nonreciprocal circuit device of the present invention will be explained based on FIGS. 16 and 17. FIG. 16 is an exploded perspective view of yet another nonreciprocal circuit device of the present invention, and FIG. 17 is a cross-sectional view taken along the line A'-A' of FIG. 16.

Figure 17:
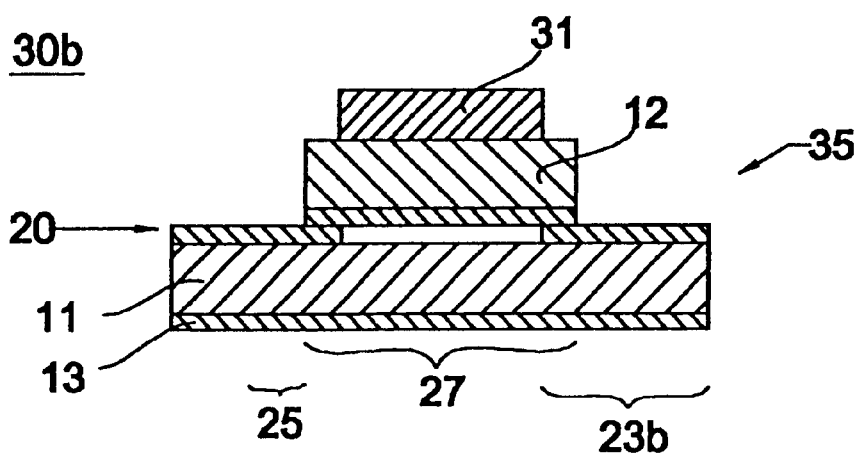
FIG. 17 is a cross-sectional view taken along the line A'—A' of FIG. 16.

As shown in FIGS. 16 and 17, the nonreciprocal circuit device 30*b* of the present embodiment comprises a dielectric substrate 11, a magnetic substrate 12, and a magnet 31. An electrode pattern 20 is provided on the dielectric substrate 11 and comprises three transmission line portions 23*b* intersecting each other at angles of 120°. An electrode pattern 20 is provided on the magnetic substrate 12 and comprises nonreciprocal circuit portions 27 intersecting each other at angles of 120°. In addition, matching circuit portions 25 are provided to the transmission line portions 23*b*. Then, these are arranged so that the side of the dielectric substrate 11 on which the electrode pattern 20 is provided faces the side of the magnetic substrate 12 on which the electrode pattern 20 is provided, and the transmission line portions 23*b* of the dielectric substrate 11 are attached to the nonreciprocal circuit portions 27 of the magnetic substrate 12 in three places. To connect these, soldered bumps or gold bumps are provided at the three end points of the nonreciprocal circuit portions 27 on the magnetic substrate 12, and the magnetic substrate 12 is mounted on the dielectric substrate 11 by what is known as flip-chip mounting. Although not shown in FIG. 16, various other functional elements and circuits to connect them are provided on the dielectric substrate 11 in addition to the nonreciprocal circuit device.

In the nonreciprocal circuit device of the above embodiment, as shown in FIGS. 16 and 17, the nonreciprocal circuit portions 27 and the resonator portion 24 in the electrode pattern 20 of the nonreciprocal circuit device main body 35 are near the magnetic substrate 12, and the transmission line portions 23*a* are near the dielectric substrate 11. Since the transmission line portions 23*a* are near the dielectric substrate 11, propagation loss of the transmission line portions 23*a* is reduced, enabling them to be made smaller than conventional guide portions having the same characteristics. Similarly, since the nonreciprocal circuit portions 27 and the resonator portion 24 are near the magnetic substrate 12, the nonreciprocity of the device is improved.

In the embodiment of FIGS. 16–17, the magnetic substrate 12 having an electrode pattern 20 need only be flip-chip mounted on the necessary portion, so that the magnetic substrate 12 is not used wastefully. Moreover, it is possible to use flip-chip mounting techniques such as ordinary bump connection, thereby facilitating manufacture.

The nonreciprocal circuit device described above uses three terminals, but the present invention can also be applied to an isolator formed by connecting a terminal resistor to one of the three terminals, or to a two-terminal isolator.

Figure 18:
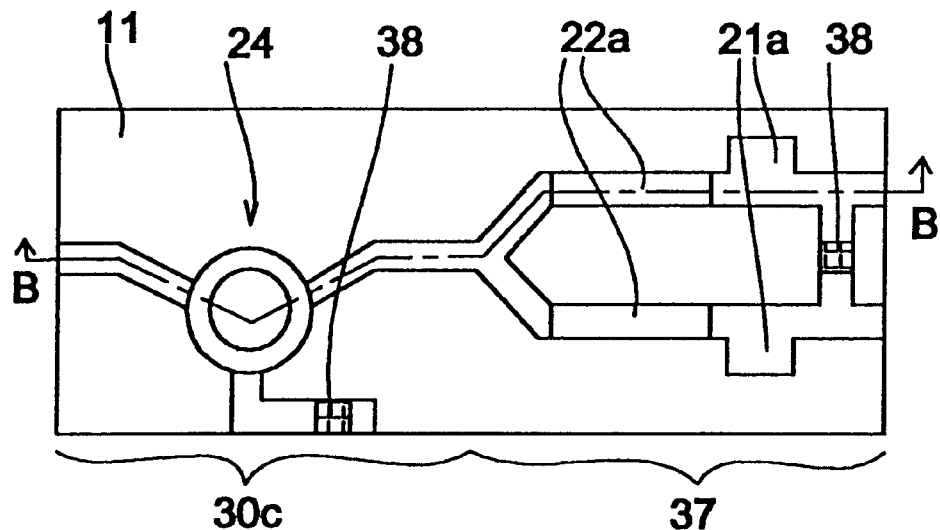
FIG. 18 is a plan view of a circuit module according to an embodiment of the present invention.

Next, an example where the present invention is applied to a circuit module, comprising multiple elements provided on a single substrate, will be explained based on FIGS. 18 and 19. FIG. 18 is a plan view of a circuit module of the present invention, and FIG. 19 is a cross-sectional view taken along the line B—B of FIG. 18.

Figure 19:
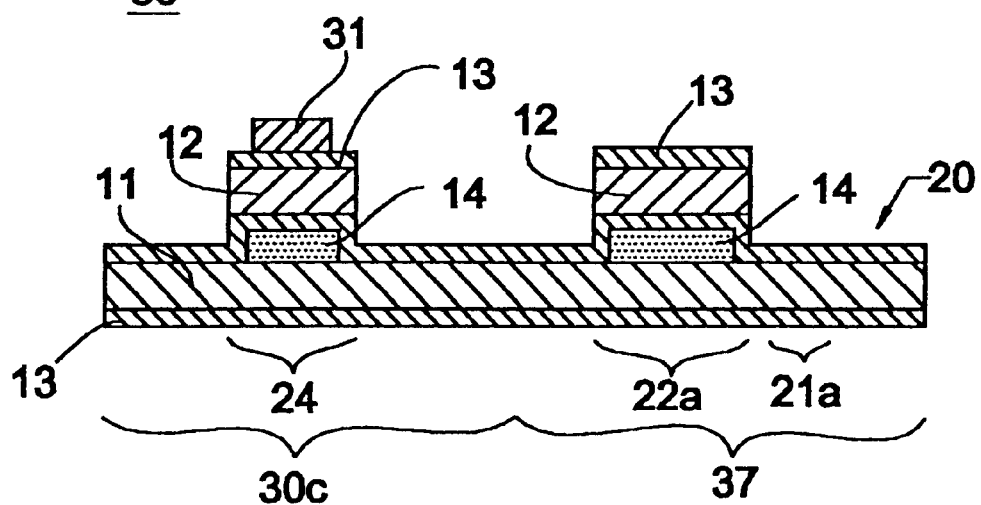
FIG. 19 is a cross-sectional view taken along the line B—B of FIG. 18.

As shown in FIGS. 18 and 19, the circuit module 36 of the present embodiment comprises as its functional elements a nonreciprocal circuit device portion 30*c* and a branch circuit portion 37. The nonreciprocal circuit device 30*c* is an isolator with a resistance film 38 connected to one of its terminals. The branch circuit portion 37 comprises a capacitance element portion 21*a,* an inductance element portion 22*a,* and a resistance film 38.

To construct this type of circuit module 36, films 14 of low dielectric constant are first provided at predetermined positions on a dielectric substrate 11 having a ground electrode 13, that is, at positions corresponding to the resonator portion 24 of the nonreciprocal circuit device 30c and the inductance element portion 22a of the branch circuit portion 37. Then, electrode patterns 20 of the nonreciprocal circuit device 30c and the branch circuit portion 37 are provided on the dielectric substrate 11 on which the films 14 of low dielectric constant 14 are provided. Further, resistance films 38 are provided to the nonreciprocal circuit device 30c and the branch circuit portion 37. Then, magnetic substrates 12 having ground electrodes 13 thereon are affixed on the electrodes of the resonator portion 24 of the nonreciprocal circuit device 30c and the inductance element portion 22a of the branch circuit portion 37. In addition, a magnet 31 for applying a dc magnetic field is provided on top of the magnetic substrate 12 of the resonator portion 24 of the nonreciprocal circuit device 30c.

The magnetic substrates may be provided only at predetermined positions, as in the present embodiment, or alternatively, a magnetic substrate which is the same shape as the dielectric substrate may be used.

Furthermore, while the circuit module of the present embodiment may be formed using the method described above, that is, by providing a film of low dielectric constant on the dielectric substrate and then adding the inductance element portion and the resonator portion of the nonreciprocal circuit device on top of the film of low dielectric constant, it is acceptable to use an alternative method, such as that shown in FIG. 7, where electrode patterns are provided on the top and bottom faces of a substrate of low dielectric constant, the electrode patterns are connected by through holes, and the substrate of low dielectric constant is clasped between the dielectric substrate and a magnetic substrate.

Figure 20:
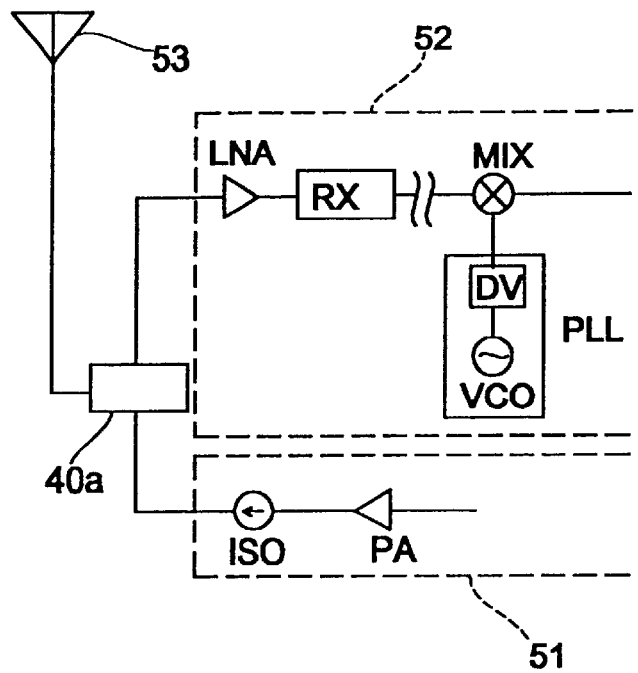
FIG. 20 is a schematic view of another communications device according to an embodiment of the present invention.

Next, another communications device 60a of the present invention, which differs from that described earlier, will be explained based on FIG. 20. FIG. 20 is a schematic diagram showing a communications device according to an embodiment of the present invention.

As shown in FIG. 20, the communications device 60a of the present embodiment comprises a duplexer 40a, comprising a filter for transmitting and a filter for receiving, an antenna 53 connected to an antenna connection of the duplexer 40a, a circuit for transmitting 51 connected to an input/output connection of the filter for transmitting of the duplexer 40a, and a circuit for receiving 52 connected to an input/output connection of the filter for receiving of the duplexer 40a.

The circuit for transmitting 51 has a power amplifier (PA) for amplifying transmission signals, which pass through the isolator and the filter for transmitting and are emitted from the antenna 53. Furthermore, signals received by the antenna 53 pass through the filter for receiving to the circuit for receiving 52, where they pass through a low noise amplifier (LNA), a filter (RX), and the like, and are finally input to a mixer (MIX). On the other hand, a local oscillator using a phase-lock loop (PLL) comprises an oscillator (VCO) and a divider (DIV), and outputs a local signal to the mixer. The mixer outputs signals at intermediate frequency.

With such a constitution, it is possible to provide a miniaturized communications device 60a using a nonreciprocal circuit device with low propagation loss and excellent nonreciprocity.

Figure 21:
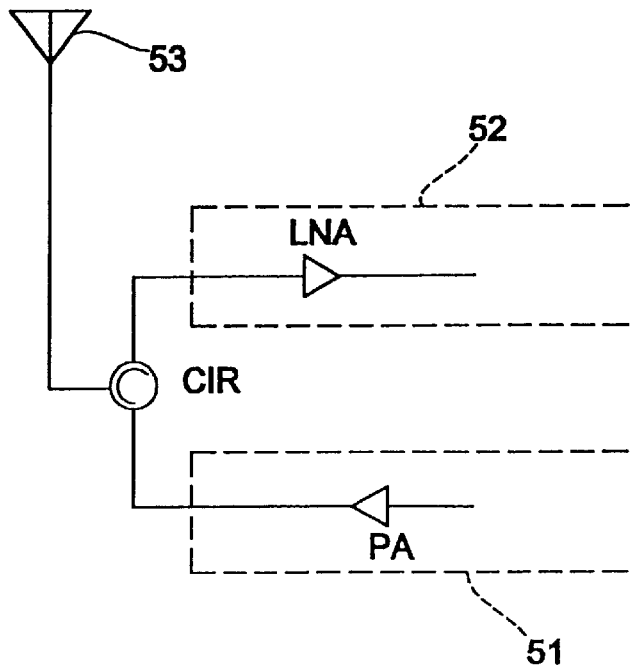
FIG. 21 is a schematic view of another communications device according to an embodiment of the present invention.
Figure 22:
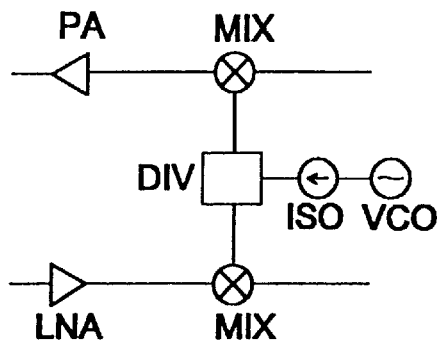
FIG. 22 is a schematic view of another communications device according to an embodiment of the present invention.
Figure 23:
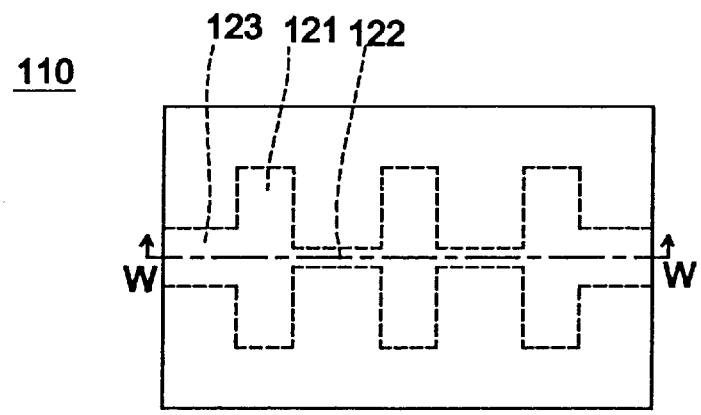
FIG. 23 is a plan view of a conventional complex circuit board.
Figure 24:
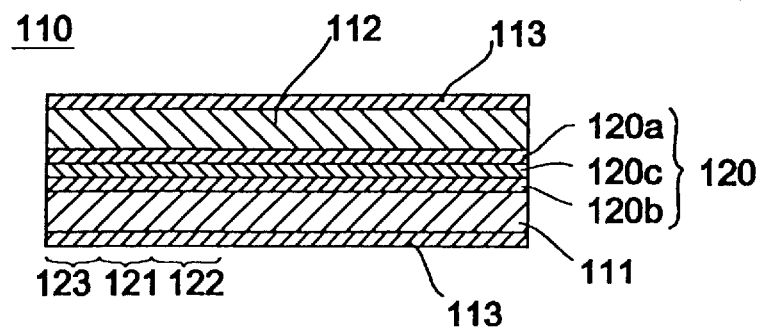
FIG. 24 is a cross-sectional view taken along the line W—W of FIG. 23.

The communications device of the present invention is not limited to that described in the embodiments above, and can for instance be applied in communications devices 60b and 60c shown in FIG. 21 and FIG. 22. The communications device 60b shown in FIG. 21 comprises an antenna 53, a circulator (CIR) connected to the antenna 53, and a circuit for transmitting 51 and a circuit for receiving 52 which are connected to the circulator (CIR). The circuit for transmitting contains a power amplifier (PA) or the like, and the circuit for receiving contains a low noise amplifier (LNA) or the like. Furthermore, the communications device 60c shown in FIG. 22 comprises a power amplifier (PA) incorporated in the circuit for transmitting, a mixer (MIX) connected to the power amplifier (PA), a low noise amplifier (LNA) incorporated in the circuit for receiving, a mixer (MIX) connected to the low noise amplifier (LNA), a divider (DIV) connecting to both the mixers (MIX), and an oscillator (VCO) connected to the divider (DIV). An isolator (ISO) is connected between the divider (DIV) and the oscillator (VCO).

According to the present invention described above, in a complex circuit board comprising a dielectric substrate, a magnetic substrate, and electrodes clasped therebetween, an electrode at a predetermined position is provided near to the dielectric substrate, and an electrode at another position is provided near to the magnetic substrate. As a result, by for instance providing the inductance element portion of the electrode near to the magnetic substrate, and providing the capacitance element portion near to the dielectric substrate, the inductance and capacitance can be increased, enabling the device to be miniaturized while retaining the same characteristics. Furthermore, in an electrode comprising a transmission line, a resistor, and the like, the positional relationship between the dielectric substrate and the magnetic substrate can be precisely designed by selecting an appropriate thickness of the film of low dielectric constant, making it possible to easily achieve the required characteristics.

Furthermore, according to the nonreciprocal circuit device of the present invention, the electrodes clasped between the magnetic substrate and the dielectric substrate of the nonreciprocal circuit device main body are arranged so that the resonator portion is near the magnetic substrate, and the transmission line portion is near the dielectric substrate. This reduces the propagation loss of the transmission line portion, and enables the device to be made smaller than conventional devices having the same characteristics. Furthermore, since the resonator portion is near the magnetic substrate, the nonreciprocity of the nonreciprocal circuit device is increased. The nonreciprocity can be further improved by inserting a substance of low dielectric constant between the resonator portion of the electrode and the dielectric substrate, whereby the coupling between the resonator portion and the dielectric substrate is weaker than in a case when, for instance, the resonator portion is moved nearer to the magnetic substrate by providing a bump in the dielectric substrate.

The invention is not limited to the foregoing embodiments, but rather extends to all modifications, equivalents and alternate embodiments that might occur to one having the ordinary level of skill in the art.

What is claimed is:

1. A method for manufacturing a complex circuit board comprising the steps of: providing a dielectric substrate; providing a film of low dielectric constant, comprising a substance having a lower dielectric constant than the dielectric substrate, on said dielectric substrate; providing an electrode pattern on the dielectric substrate and on the film of low dielectric constant thereon; and affixing a magnetic substrate to the dielectric substrate and to the electrode pattern thereon.

2. A method for manufacturing a complex circuit board comprising the steps of: providing a dielectric substrate; providing a magnetic substrate; providing electrode patterns respectively on top and bottom faces of a substrate of low dielectric constant having a lower dielectric constant than the dielectric substrate; providing a through hole running between the electrode pattern on the top face and the electrode pattern on the bottom face; and affixing said dielectric substrate to said magnetic substrate so as to clasp said substrate of low dielectric constant therebetween.

3. A method for manufacturing a nonreciprocal circuit device comprising the steps of: providing a dielectric substrate; providing a film of low dielectric constant, comprising a substance having a lower dielectric constant than the dielectric substrate, on said dielectric substrate; providing an electrode pattern comprising a resonator portion which is formed at the portion of said dielectric substrate where said film of low dielectric constant is provided, and a transmission line portion which is formed at other portions thereof; affixing a magnetic substrate to said dielectric substrate and to said electrode pattern; and providing a magnet for applying a dc magnetic field to said electrode pattern.

4. A method for manufacturing a nonreciprocal circuit device comprising the steps of: providing a dielectric substrate; providing a magnetic substrate; providing electrode patterns respectively on top and bottom faces of a substrate of low dielectric constant having a lower dielectric constant than the dielectric substrate, the electrode patterns forming a resonator portion and a transmission line portion; providing a through hole running between the electrode pattern on the top face and the electrode pattern on the bottom face; affixing said dielectric substrate to said magnetic substrate so as to clasp said substrate of low dielectric constant therebetween, and so that said magnetic substrate is adjacent to or spaced a predetermined distance from the resonator portion, and said dielectric substrate is adjacent to or spaced a predetermined distance from the transmission line portion; and providing a magnet applying a dc magnetic field to said electrode patterns.

5. The method according to one of claims 1 and 3, further comprising the step of providing an additional substance having a lower dielectric constant than the dielectric substrate, said additional substance being disposed between said magnetic substrate and said electrode.

6. The method according to claim 5, wherein said additional substance is an air space.

* * * * *